(12) United States Patent
Kim et al.

(10) Patent No.: US 12,165,979 B2
(45) Date of Patent: Dec. 10, 2024

(54) PACKAGING SUBSTRATE AND SEMICONDUCTOR APPARATUS COMPRISING SAME

(71) Applicant: ABSOLICS INC., Covington, GA (US)

(72) Inventors: Sungjin Kim, Suwanee, GA (US); Youngho Rho, Daejeon (KR); Jincheol Kim, Hwaseong-si (KR); Byungkyu Jang, Suwon-si (KR)

(73) Assignee: ABSOLICS INC., Covington, GA (US)

( * ) Notice: Subject to any disclaimer, the term of this patent is extended or adjusted under 35 U.S.C. 154(b) by 492 days.

(21) Appl. No.: 17/406,304

(22) Filed: Aug. 19, 2021

(65) Prior Publication Data

US 2021/0384131 A1    Dec. 9, 2021

Related U.S. Application Data

(63) Continuation of application No. PCT/KR2020/003167, filed on Mar. 6, 2020.

(Continued)

(51) Int. Cl.
| | | |
|---|---|---|
| *H01L 23/538* | (2006.01) | |
| *H01L 23/15* | (2006.01) | |
| *H01L 25/18* | (2023.01) | |

(52) U.S. Cl.
CPC .......... *H01L 23/5383* (2013.01); *H01L 23/15* (2013.01); *H01L 23/5384* (2013.01); *H01L 23/5385* (2013.01); *H01L 25/18* (2013.01)

(58) Field of Classification Search
CPC .............. H01L 23/534; H01L 23/481; H01L 23/49827; H01L 21/486
See application file for complete search history.

(56) References Cited

U.S. PATENT DOCUMENTS

| | | |
|---|---|---|
| 4,835,598 A | 5/1989 | Higuchi et al. |
| 5,304,743 A | 4/1994 | Sen et al. |

(Continued)

FOREIGN PATENT DOCUMENTS

| | | |
|---|---|---|
| CN | 1317163 A | 10/2001 |
| CN | 1614464 A | 5/2005 |

(Continued)

OTHER PUBLICATIONS

International Search Report issued on Jul. 1, 2020 in counterpart International Patent Application No. PCT/KR2020/003167 (2 pages in English and 2 pages in Korean).

*Primary Examiner* — Victor A Mandala
*Assistant Examiner* — Lawrence C Tynes, Jr.
(74) *Attorney, Agent, or Firm* — NSIP Law

(57) ABSTRACT

A semiconductor apparatus includes a semiconductor element unit comprising one or more semiconductor elements, a packaging substrate, and a motherboard. The packaging substrate, connected to the semiconductor elements, includes a core layer and an upper layer disposed on the core layer. The core layer includes a glass substrate, a core via, and a core distribution layer. The glass substrate having a first surface and a second surface facing each other. A part of the core distribution layer connects electrically conductive layers of the first surface and an electrically conductive layer of the second surface through the core via penetrating through the glass substrate. A thickness of a thinner one among electrically conductive layers of the core distribution layer is the same as or greater than a width of a thinner one among the electrically conductive layers of the upper layer.

10 Claims, 7 Drawing Sheets

Related U.S. Application Data

(60) Provisional application No. 62/814,945, filed on Mar. 7, 2019, provisional application No. 62/814,949, filed on Mar. 7, 2019.

(56) References Cited

U.S. PATENT DOCUMENTS

| | | |
|---|---|---|
| 5,414,222 A | 5/1995 | Sen et al. |
| 6,610,934 B2 | 8/2003 | Yamaguchi et al. |
| 8,774,580 B2 | 7/2014 | Bolle |
| 9,167,694 B2 | 10/2015 | Sundaram et al. |
| 9,263,370 B2 | 2/2016 | Shenoy et al. |
| 9,420,708 B2 | 8/2016 | Hibino et al. |
| 9,768,090 B2 | 9/2017 | Liang et al. |
| 10,483,210 B2 | 11/2019 | Gross et al. |
| 2002/0093120 A1 | 7/2002 | Magni et al. |
| 2002/0180015 A1 | 12/2002 | Yamaguchi et al. |
| 2005/0214479 A1 | 9/2005 | Erben et al. |
| 2006/0179341 A1 | 8/2006 | Harrod |
| 2006/0182556 A1 | 8/2006 | Liu et al. |
| 2006/0202322 A1 | 9/2006 | Kariya et al. |
| 2006/0226094 A1 | 10/2006 | Cho et al. |
| 2008/0017407 A1 | 1/2008 | Kawano |
| 2008/0217761 A1 | 9/2008 | Yang et al. |
| 2009/0117336 A1 | 5/2009 | Usui et al. |
| 2010/0224524 A1 | 9/2010 | Yuasa et al. |
| 2012/0106117 A1 | 5/2012 | Sundaram et al. |
| 2012/0153463 A1 | 6/2012 | Maeda |
| 2012/0186866 A1 | 7/2012 | Mikado et al. |
| 2013/0050227 A1 | 2/2013 | Petersen et al. |
| 2013/0069251 A1 | 3/2013 | Kunimoto et al. |
| 2013/0293482 A1 | 11/2013 | Burns et al. |
| 2014/0034374 A1 | 2/2014 | Cornejo et al. |
| 2014/0085847 A1 | 3/2014 | Takizawa |
| 2014/0116763 A1 | 5/2014 | Sato et al. |
| 2014/0116767 A1 | 5/2014 | Sato et al. |
| 2014/0326686 A1 | 11/2014 | Li et al. |
| 2015/0027757 A1 | 1/2015 | Shin et al. |
| 2015/0235915 A1 | 8/2015 | Liang et al. |
| 2015/0235936 A1 | 8/2015 | Yu et al. |
| 2015/0235989 A1 | 8/2015 | Yu et al. |
| 2015/0245486 A1 | 8/2015 | Shin et al. |
| 2016/0111380 A1* | 4/2016 | Sundaram ......... H01L 23/49822 438/126 |
| 2016/0218083 A1* | 7/2016 | Kariyazaki ........... H01L 23/147 |
| 2016/0286660 A1 | 9/2016 | Gambino et al. |
| 2016/0300740 A1 | 10/2016 | Xu |
| 2016/0351545 A1 | 12/2016 | Hong et al. |
| 2017/0040265 A1 | 2/2017 | Park et al. |
| 2017/0064835 A1 | 3/2017 | Ishihara et al. |
| 2017/0144844 A1 | 5/2017 | Dong |
| 2017/0154860 A1 | 6/2017 | Hareyama |
| 2017/0179013 A1 | 6/2017 | Kunimoto |
| 2017/0186710 A1 | 6/2017 | Yoon et al. |
| 2017/0223825 A1 | 8/2017 | Thadesar et al. |
| 2017/0363580 A1 | 12/2017 | Ahmad et al. |
| 2018/0068868 A1 | 3/2018 | Jaramillo et al. |
| 2018/0139844 A1 | 5/2018 | You |
| 2018/0226351 A1 | 8/2018 | Park et al. |
| 2018/0240778 A1 | 8/2018 | Liu et al. |
| 2018/0342450 A1 | 11/2018 | Huang et al. |
| 2018/0342451 A1 | 11/2018 | Dahlberg et al. |
| 2019/0269013 A1 | 8/2019 | Takagi et al. |
| 2020/0126923 A1* | 4/2020 | Hu ..................... H01L 21/0274 |
| 2023/0062692 A1 | 3/2023 | Park |

FOREIGN PATENT DOCUMENTS

| | | |
|---|---|---|
| CN | 1938342 A | 3/2007 |
| CN | 101039549 A | 9/2007 |
| CN | 101189921 A | 5/2008 |
| CN | 101371355 A | 2/2009 |
| CN | 101415626 A | 4/2009 |
| CN | 102097330 A | 6/2011 |
| CN | 102106198 A | 6/2011 |
| CN | 102122691 A | 7/2011 |
| CN | 102246299 A | 11/2011 |
| CN | 102844857 A | 12/2012 |
| CN | 103188866 A | 7/2013 |
| CN | 103208480 A | 7/2013 |
| CN | 106029286 A | 10/2016 |
| CN | 106449574 A | 2/2017 |
| CN | 107112297 A | 8/2017 |
| CN | 107683524 A | 2/2018 |
| CN | 107758041 A | 3/2018 |
| CN | 107848878 A | 3/2018 |
| CN | 108878343 A | 11/2018 |
| CN | 109411432 A | 3/2019 |
| EP | 0 526 456 B1 | 8/1998 |
| EP | 1732937 A1 | 12/2006 |
| EP | 1 988 758 A1 | 11/2008 |
| EP | 3 083 125 B1 | 10/2016 |
| JP | 2000-142876 A | 5/2000 |
| JP | 2001-7531 A | 1/2001 |
| JP | 3173250 B2 | 3/2001 |
| JP | 2004-311919 A | 11/2004 |
| JP | 2004-349472 A | 12/2004 |
| JP | 2005-235497 A | 9/2005 |
| JP | 2007-80720 A | 3/2007 |
| JP | 2007-227967 A | 9/2007 |
| JP | 2007-281251 A | 10/2007 |
| JP | 2007-281252 A | 10/2007 |
| JP | 3998984 B2 | 10/2007 |
| JP | 2007-291396 A | 11/2007 |
| JP | 2007-530682 A | 11/2007 |
| JP | 4012375 B2 | 11/2007 |
| JP | 2009-295862 A | 12/2009 |
| JP | 2010-80679 A | 4/2010 |
| JP | 2011-228495 A | 11/2011 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2014-236029 A | 12/2014 |
| JP | 2015-18675 A | 1/2015 |
| JP | 2015-70189 A | 4/2015 |
| JP | 2015-80800 A | 4/2015 |
| JP | 2015-95590 A | 5/2015 |
| JP | 2015-103586 A | 6/2015 |
| JP | 2016-18831 A | 2/2016 |
| JP | 2016-34030 A | 3/2016 |
| JP | 2016-111221 A | 6/2016 |
| JP | 2016-136615 A | 7/2016 |
| JP | 2016-213253 A | 12/2016 |
| JP | 2016-213466 A | 12/2016 |
| JP | 2016-225620 A | 12/2016 |
| JP | 2017-5174 A | 1/2017 |
| JP | 2017-41645 A | 2/2017 |
| JP | 2017-50315 A | 3/2017 |
| JP | 2017-510531 A | 4/2017 |
| JP | 6110437 B2 | 4/2017 |
| JP | 2017-112209 A | 6/2017 |
| JP | 2017-121648 A | 7/2017 |
| JP | 2018-120902 A | 8/2017 |
| JP | 2017-216398 A | 12/2017 |
| JP | 6273873 B2 | 2/2018 |
| JP | 2018-107256 A | 7/2018 |
| JP | 2018-107423 A | 7/2018 |
| JP | 2018-116951 A | 7/2018 |
| JP | 2018-148086 A | 9/2018 |
| JP | 2018-160697 A | 10/2018 |
| JP | 2018-163901 A | 10/2018 |
| JP | 2018-163986 A | 10/2018 |
| JP | 2018-174189 A | 11/2018 |
| JP | 2018-174190 A | 11/2018 |
| JP | 2018-199605 A | 12/2018 |
| JP | 2019-16672 A | 1/2019 |
| KR | 10-1997-0050005 A | 7/1997 |
| KR | 10-0184043 B1 | 5/1999 |
| KR | 10-2001-0107033 A | 12/2001 |
| KR | 10-2002-0008574 A | 1/2002 |
| KR | 20-0266536 Y1 | 2/2002 |

(56) References Cited

FOREIGN PATENT DOCUMENTS

| | | |
|---|---|---|
| KR | 10-0447323 B1 | 9/2004 |
| KR | 10-0538733 B1 | 12/2005 |
| KR | 10-2006-0111449 A | 10/2006 |
| KR | 10-2006-0134133 A | 12/2006 |
| KR | 10-0687557 B1 | 2/2007 |
| KR | 10-0720090 B1 | 5/2007 |
| KR | 10-2007-0076737 A | 7/2007 |
| KR | 10-2007-0085553 A | 8/2007 |
| KR | 10-0794961 B1 | 1/2008 |
| KR | 10-2008-0047127 A | 5/2008 |
| KR | 10-0859206 B1 | 9/2008 |
| KR | 10-0870685 B1 | 11/2008 |
| KR | 10-2010-0044450 A | 4/2010 |
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0027159 A | 3/2013 |
| KR | 10-2013-0038825 A | 4/2013 |
| KR | 10-2014-0044746 A | 4/2014 |
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0003050 A | 1/2019 |
| KR | 10-2019-0008103 A | 1/2019 |
| KR | 10-1944718 B1 | 2/2019 |
| KR | 10-2019-0026676 A | 3/2019 |
| TW | 200609240 A | 3/2006 |
| TW | 201929100 A | 7/2019 |
| WO | WO 2004/053983 A1 | 6/2004 |
| WO | WO 2005/097843 A1 | 10/2005 |
| WO | WO 2006/050205 A2 | 5/2006 |
| WO | WO 2018/013054 A1 | 1/2008 |
| WO | WO 2008/105496 A1 | 9/2008 |
| WO | WO 2009/005492 A1 | 1/2009 |
| WO | WO 2012/061304 A1 | 5/2012 |
| WO | WO 2015/198912 A1 | 12/2015 |
| WO | WO 2016/052221 A1 | 4/2016 |
| WO | WO 2017/057645 A1 | 4/2017 |
| WO | WO 2017/188281 A1 | 11/2017 |
| WO | WO 2018/101468 A1 | 6/2018 |

* cited by examiner (a)

(b)

PACKAGING SUBSTRATE AND SEMICONDUCTOR APPARATUS COMPRISING SAME

CROSS-REFERENCE TO RELATED APPLICATION

Pursuant to 35 USC 120 and 365(c), this application is a continuation of International Application No. PCT/KR2020/003167 filed on Mar. 6, 2020, and claims priority to U.S. Provisional Patent Application No. 62/814,945, filed on Mar. 7, 2019, and U.S. Provisional Patent Application No. 62/814,949 filed on Mar. 7, 2019, the entire disclosures of which are incorporated herein by reference for all purposes.

BACKGROUND

1. Field

The following description relates to a packaging substrate and semiconductor apparatus comprising same.

2. Description of Related Art

In the manufacturing of electronic components, implementing a circuit on a semiconductor wafer is referred to as a Front-End Process (FE), and the assembly of a wafer such that it can be actually used in a product is referred to as a Back-End Process (BE). Back-End process includes a packaging process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but the technology of complete packaging is not being supported. Thus, it is considered that the electrical performance of packaged semiconductors may be determined by the packaging technology with an electrical connection rather than the performance of the semiconductor itself.

Ceramic or resin is used as the material of a packaging substrate. However, it is not easy to mount a high-performance and high-frequency semiconductor element in a ceramic substrate due to high resistance or high dielectric constant. In the case of a resin substrate, it is possible to mount a high-performance and high-frequency semiconductor element thereon, but there is a distinct limitation to reducing pitches of conductive lines.

Recently, researches are being conducted to apply silicon or glass to a high-end packaging substrate. By forming a through-via on a silicon or glass substrate and applying a conductive material into the through-via, it is possible to shorten the length of conductive lines between an element and a motherboard, therefore have excellent electric characteristics.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor apparatus includes a semiconductor element unit including one or more semiconductor elements, a packaging substrate, and a motherboard. The packaging substrate, connected to the semiconductor elements, includes a core layer and an upper layer disposed on the core layer. The core layer includes a glass substrate, a core via, and a core distribution layer disposed on a surface of the glass substrate or a surface of the core via, the glass substrate having a first surface and a second surface facing each other. The motherboard is connected to the packaging substrate, transmitting electrical signals of the one or more semiconductor elements and external, and connecting each other, The core via penetrates through the glass substrate in a thickness direction in plural number. At least a part of the core distribution layer connects electrically conductive layers of the first surface and an electrically conductive layer of the second surface through the core via penetrating through the glass substrate. The upper layer is disposed on the first surface and includes an electrically conductive layer connecting the core distribution layer and an external semiconductor element unit. A thickness of a thinner one among electrically conductive layers of the core distribution layer is the same as or greater than a width of a thinner one among the electrically conductive layers of the upper layer.

The thickness of the thinner one among the electrically conductive layers of the core distribution layer may be greater than the width of the thinner one among the electrically conductive layers of the upper layer by 1 to 12 times.

The semiconductor apparatus may further include an upper insulating layer and an upper distribution pattern. The upper insulating layer may be disposed on the first surface. The upper distribution pattern at least partially including a fine pattern may be at least partially connected to the core distribution layer. The upper distribution pattern may be an electrically conductive layer embedded in the upper insulating layer. The fine pattern may have a width of less than 4 μm with an interval of less than 4 μm.

A second surface distribution pattern may be an electrically conductive layer disposed on the second surface. A width of an electrically conductive layer having a greater width within the second surface distribution pattern may be 1 to 20 times of a width of one having a thinner width among the electrically conductive layers of the upper layer.

In another general aspect, a packaging substrate includes a core layer and an upper layer disposed on the core layer. The core layer includes a glass substrate, a core via, and a core distribution layer disposed on a surface of the glass substrate or a surface of the core via. The glass substrate has a first surface and a second surface facing each other. The core via penetrates through the glass substrate in a thickness direction in a plural number. At least a part of the core distribution layer connects an electrically conductive layer of the first surface and an electrically conductive layer of the second surface through the core via penetrating through the glass substrate. The upper layer is disposed on the first surface and includes an electrically conductive layer connecting the core distribution layer and an external semiconductor element unit. A thickness of a thinner one among electrically conductive layers of the core distribution layer is the same as or greater than a width of a thinner one among the electrically conductive layers of the upper layer.

In another general aspect, a semiconductor apparatus includes a semiconductor element unit including one or more semiconductor elements, a packaging substrate, and a motherboard. The packaging substrate, connected to the semiconductor elements, includes a core layer and an upper layer disposed on the core layer. The core layer includes a glass substrate, a core via, and a core distribution layer disposed on a surface of the glass substrate or a surface of the core via. The glass substrate has a first surface and a second surface facing each other. A motherboard is connected to the packaging substrate, transmitting electrical signals of the one or more semiconductor elements and external, and connecting each other, The core via penetrates through the glass substrate in a thickness direction in plural number. At least a part of the core distribution layer connects an electrically conductive layer of the first surface and an electrically conductive layer of the second surface through the core vias. The upper layer is disposed on the first surface and includes an electrically conductive layer connecting the core distribution layer and an external semiconductor element unit. A thickness of a thinner one among electrically conductive layers of the core distribution layer is the same as or greater than a thickness of a thinner one among the electrically conductive layers of the upper layer.

The thickness of the thinner one among the electrically conductive layers of the core distribution layer may be greater than the thickness of the thinner one among the electrically conductive layers of the upper layer by 0.7 to 12 times.

The semiconductor apparatus may further include an upper insulating layer and an upper distribution pattern. The upper insulating layer may be disposed on the first surface. The upper distribution pattern at least partially including a fine pattern may be at least partially connected to the core distribution layer. The upper distribution pattern may be an electrically conductive layer embedded in the upper insulating layer. The fine pattern may have a width of less than 4 μm with an interval of less than 4 μm.

A second surface distribution pattern may be an electrically conductive layer disposed on the second surface. A thickness of an electrically conductive layer having a greater thickness among the second surface distribution pattern may be 0.7 to 20 times of the thickness of thinner one among the electrically conductive layers of the upper layer.

In another general aspect, a packaging substrate includes a core layer and an upper layer disposed on the core layer. The core layer includes a glass substrate, a core via, and a core distribution layer disposed on a surface of the glass substrate or a surface of the core via. The glass substrate has a first surface and a second surface facing each other. The core via penetrates through the glass substrate in a thickness direction in plural number. At least a part of the core distribution layer connects an electrically conductive layer of the first surface and an electrically conductive layer of the second surface through the core via penetrating through the glass substrate. The upper layer is disposed on the first surface and includes an electrically conductive layer connecting the core distribution layer and an external semiconductor element unit. A thickness of a thinner one among electrically conductive layers of the core distribution layer is the same as or greater than a thickness of a thinner one among the electrically conductive layers of the upper layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
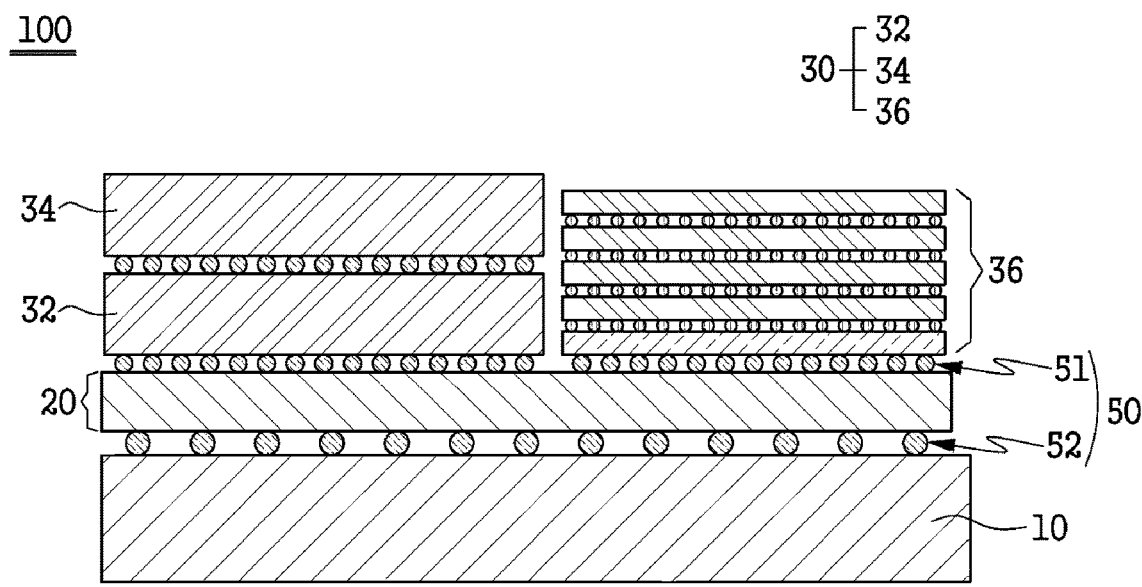
FIG. 1 is a conceptual view for illustrating a cross-section of a semiconductor apparatus according to one embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Throughout the embodiments, the phrase "combination(s) thereof" included in a Markush-type expression denotes one or more mixtures or combinations selected from the group consisting of components stated in the Markush-type expression, that is, denotes that one or more components selected from the group consisting of the components are included.

In this application, the term "X-based" may mean that a compound includes a compound corresponding to X or a derivative of X.

In this application, "B being disposed on A" means that B is disposed in direct contact with A or disposed over A with another layer interposed therebetween and thus should not be interpreted as being limited to B being placed in direct contact with A.

The inventors of have recognized that, in developing a semiconductor apparatus capable of exhibiting high performance with a more integrated and thinner thickness, the apparatus itself and the packaging process are important factors for improving its performance. The inventors have confirmed that, by applying a glass core in a single layer and controlling the shape of a through-via, a width and a thickness of an electrically conductive layer formed thereon, etc., it is possible to make a packaging substrate thinner and to improve the electrical property of the semiconductor apparatus unlike a conventional interposer and organic substrate in which two or more layers of cores are applied on a motherboard as a packaging substrate.

The packaging substrate and the semiconductor apparatus, including the same embodiments, can significantly improve electrical properties such as a signal transmission rate by connecting the semiconductor element and a motherboard to be closer to each other so that electrical signals are transmitted through as short a path as possible.

Also, since the glass substrate being applied as a core of substrate is an insulator itself, there is a lower possibility of parasitic element effect on the apparatus than an apparatus with a conventional silicon core. Thus, it is possible to simplify the treatment process of an insulating layer, and it can be applied to a high-speed circuit.

In addition, unlike silicon being manufactured in the form of a round wafer shape, the glass substrate is manufactured in a large panel. Thus mass production is relatively easy, and economic efficiency can be further improved.

Figure 2:
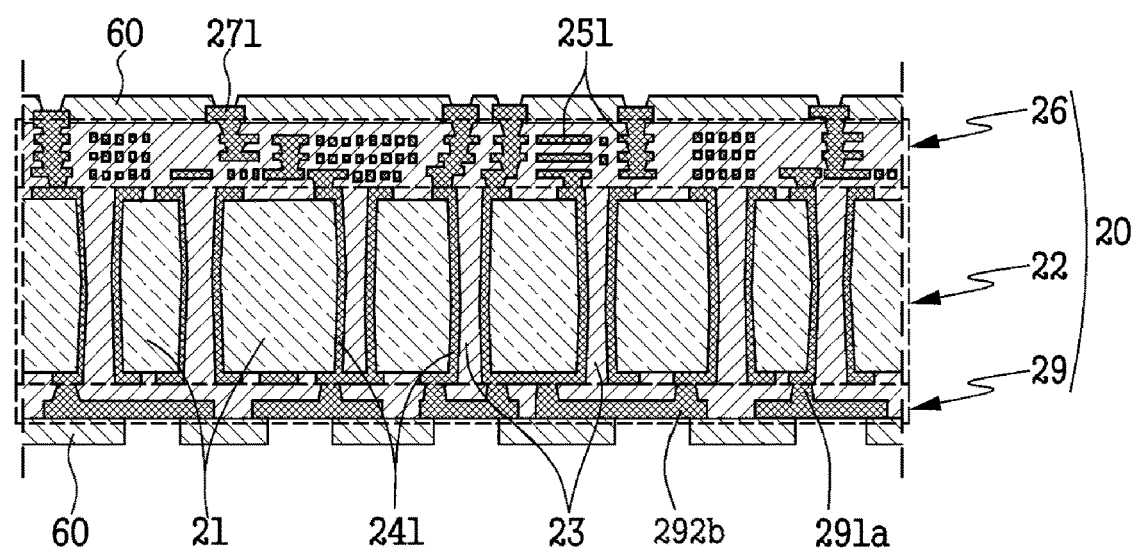
FIG. 2 is a conceptual view for illustrating a cross-section of a packaging substrate according to another embodiment.
Figure 3:
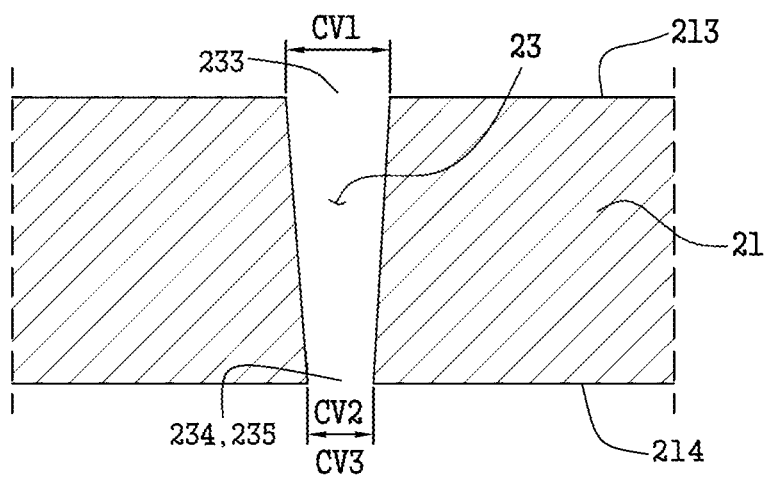
FIG. 3 depict conceptual views (a) and (b) illustrating cross-sections of a core via applied in the embodiments.
Figure 3:
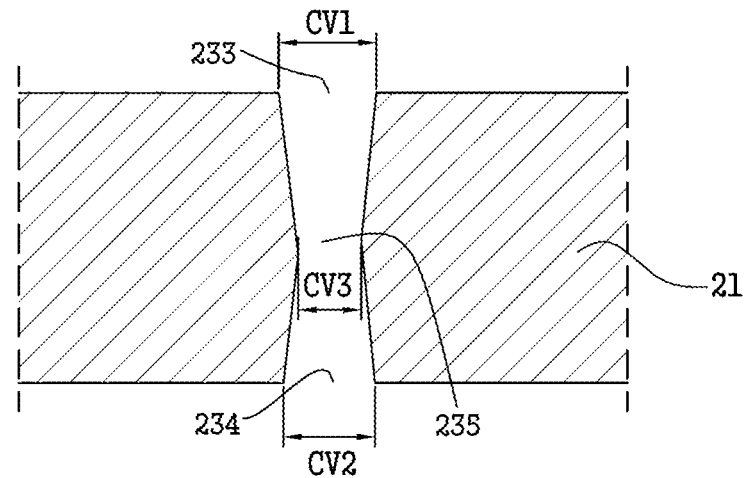
Figure 4:
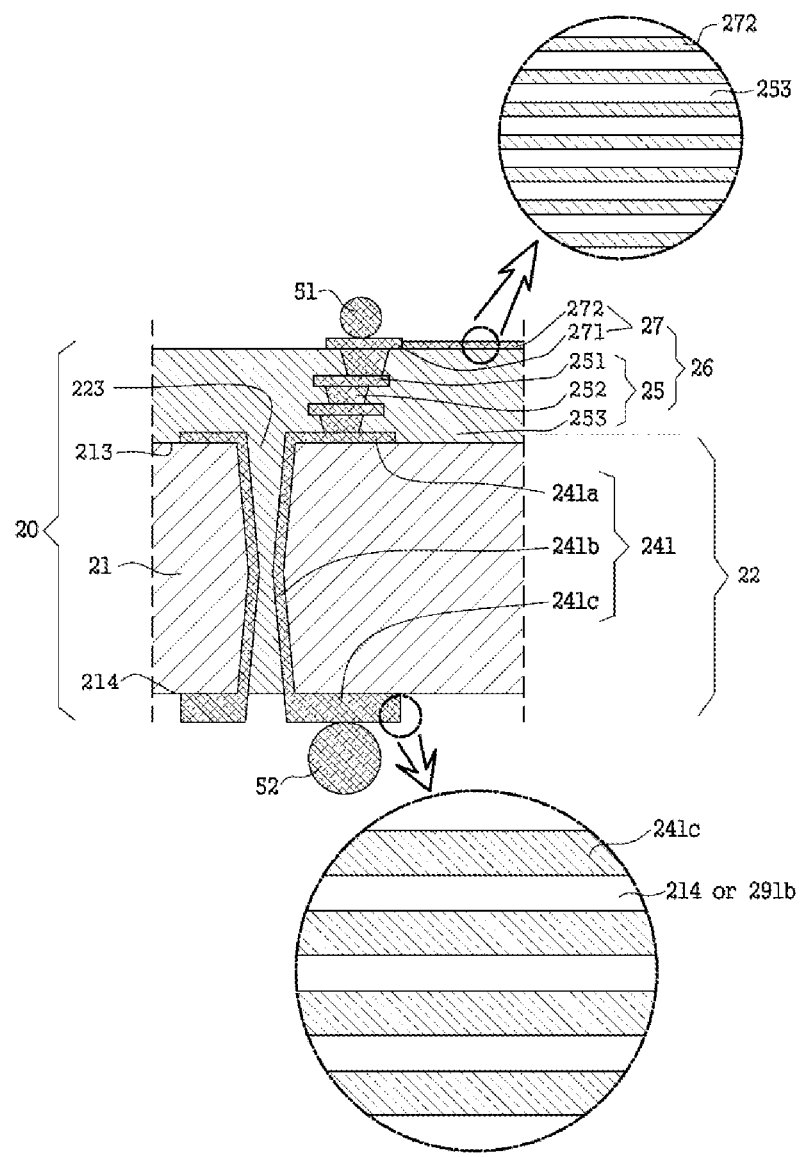
FIGS. 4 and 5 are respectively detailed conceptual views for illustrating a part of cross-sections of a packaging substrate according to the embodiments (a circle indicates a view obtained through observation from the top or the bottom)
Figure 5:
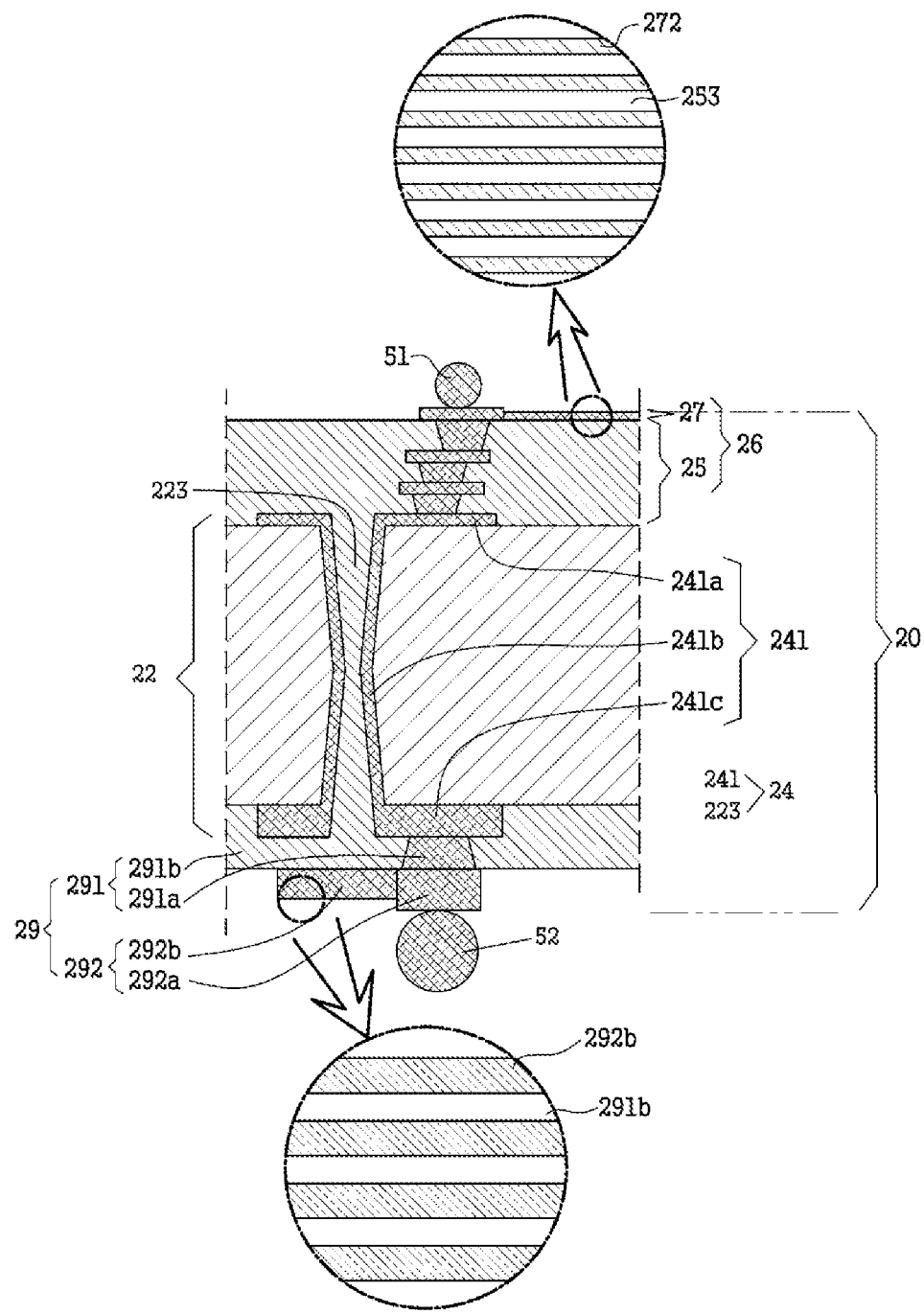

FIG. 1 is a conceptual view for illustrating a cross-section of a semiconductor apparatus according to an embodiment. FIG. 2 is a conceptual view for illustrating a cross-section of a packaging substrate according to another embodiment. FIG. 3 depicts conceptual views (a) and (b) illustrating a cross-section of a core via applied according to the embodiments. FIGS. 4 and 5 are respectively detailed conceptual views for illustrating a part of cross-sections of a packaging substrate according to an embodiment (a circle indicates a view obtained through observation from the top or the bottom). The embodiment will be described below in detail with reference to FIGS. 1 to 5.

A semiconductor apparatus 100 provided according to an embodiment to achieve the above objectives, comprises a semiconductor element unit 30 having one or more semiconductor elements 32, 34, and 36 positioned thereon; a packaging substrate 20 electrically connected to the semiconductor elements 32, 34, and 36; and a motherboard 10 electrically connected to the packaging substrate 20 and configured to transmit external electrical signals to the semiconductor elements 32, 34, and 36 and connect the semiconductor elements.

The packaging substrate 20, according to another embodiment, comprises a core layer 22 and an upper layer 26.

The semiconductor element unit 30 comprises one or more elements mounted on a semiconductor apparatus and is mounted on the packaging substrate 20 through a connecting electrode or the like. In detail, for example, a computation element such as a central processing unit (CPU) and a graphics processing unit (GPU) (a first element 32 and a second element 34), a memory element such as a memory chip (a third element 36), or the like may be applied as the semiconductor element unit 30. Still, any semiconductor element capable of being mounted on a semiconductor apparatus may be applicable without limitation.

A motherboard such as a printed circuit board and a printed wiring board may be applied as the motherboard 10.

The packaging substrate 20 comprises a core layer 22, and an upper layer 26 disposed on one side of the core layer 22.

Optionally, the packaging substrate 20 may further comprise a lower layer 29 disposed under the core layer 22.

The core layer 22 comprises a glass substrate 21; a plurality of core vias 23 passing through the glass substrate 21 in a thickness direction thereof; and a core distribution layer 24 disposed on a surface of the glass substrate 21 or a surface of the core via 23 and having an electrically conductive layer which is at least partially configured to connect an electrically conductive layer of a first surface and an electrically conductive layer of a second surface through the core vias 23 electrically.

The glass substrate 21 has a first surface 213 and a second surface 214 facing each other. The two surfaces are substantially parallel to each other and are substantially uniform thickness throughout the glass substrate.

The glass substrate 21 has a core via 23 passing through the first surface 213 and the second surface 214.

Conventionally, a silicon substrate and an organic substrate were laminated in a stack as the packaging substrate of the semiconductor apparatus. When a silicon substrate is applied to a high-speed circuit, a parasitic element effect may occur due to the semiconductive property of the silicon substrate, and a relatively large power loss may occur. Also, an organic substrate requires a larger area to form a more complicated distribution pattern, but this does not correspond to the miniaturization trend of electronic apparatuses. To form a complicated distribution pattern within a predetermined size, it may be desirable to make patterns finer substantially. Still, there has been an actual limit to the miniaturization of the patterns due to a material property of the organic substrate.

According to one or more embodiments, the glass substrate 21 is applied as a supporting body for the core layer 22 to solve these problems. Also, by applying the core via 23 formed to pass through the glass substrate 21, as well as the glass substrate 21, it is possible to provide a packaging substrate 20 having a shortened electrical flow length, a smaller size, a faster response, and a lower loss property.

As the glass substrate 21, a glass substrate applied to semiconductor field may be applied. For example, a borosilicate glass substrate, a non-alkali glass substrate, or the like may be applicable, but the embodiment is not limited thereto.

The glass substrate 21 may have a thickness of 1,000 μm or less, 100 μm to 1,000 μm, or 100 μm to 700 μm. More specifically, the glass substrate 21 may have a thickness of 100 μm to 500 μm. Although applying a thinner packaging substrate is advantageous in that electrical signal transmission can be made more efficient, but the packaging substrate also should function as a supporting body of packaging, so it is preferable to apply the glass substrate 21 having the above thickness. Here, the thickness of the glass substrate may be the thickness of the glass substrate itself, except for the thickness of the electrically conductive layer on the glass substrate.

The glass substrate 21 further has a core via 23. The core via 23 may be formed by removing a predetermined region of the glass substrate 21. In one example, the core via 23 may be formed by etching a glass plate physically and/or chemically.

In detail, the core via 23 may be formed by forming a defect (flaw) on the surface of the glass substrate utilizing a laser or the like and then applying chemical etching, laser etching, or the like. Still, the embodiment is not limited thereto.

The core via 23 comprises a first opening part 233 in contact with the first surface; a second opening part 234 in contact with the second surface; and a minimum inner diameter part 235 having the smallest inner diameter in the entire core via from the first opening part 233 to the second opening part 234.

A diameter CV1 of the first opening part may be substantially different from a diameter CV2 of the second opening part. Conversely, a diameter CV1 of the first opening part may be substantially equal to a diameter CV2 of the second opening part.

The minimum inner diameter part 235 may be disposed at the first opening part 233 or at the second opening part 234. In this case, the core via 23 may be a cylindrical type core via or a (truncated) triangular pyramid type core via. In this case, a diameter CV3 of the minimum inner diameter part 235 corresponds to the smaller one between the diameter of the first opening part 233 and the diameter of the second opening part 234.

The minimum inner diameter part 235 may be disposed between the first opening part 233 and the second opening part 234. In this case, the core via 23 may be a barrel-type core via. In this case, the diameter CV3 of the minimum inner diameter part 235 may be smaller than the larger one between the diameter of the first opening part 233 and the diameter of the second opening part 234.

The core distribution layer 24 comprises a core distribution pattern 241, electrically conductive layers for electrically connecting the first surface 213 and the second surface 214 of the glass substrate 21 through a through-via (core via), and a core insulating layer 223 covering the core distribution pattern 241.

The core layer 22 has an electrically conductive layer formed thereon through a core via and thus functions as an electrical passage passing through the glass substrate 21. Also, the core layer 22 may connect the upper and lower parts of the glass substrate 21 with a relatively short distance. Thus it may have faster electrical signal transmission and lower loss properties.

The core distribution pattern 241 comprises patterns that electrically connect the first surface 213 and the second surface 214 of the glass substrate 21 through the core via 23. Specifically, the core distribution pattern 241 comprises a first surface distribution pattern 241a, which is an electrically conductive layer disposed on at least a part of the first surface 213, a second surface distribution pattern 241c, which is an electrically conductive layer disposed on at least a part of the second surface 214, and a core via distribution pattern 241b, which is an electrically conductive layer for electrically connecting the first surface distribution pattern 241a and the second surface distribution pattern 241c to each other through the core via 23. As the electrically conductive layer, for example, a copper plating layer may be applicable, but the embodiment is not limited thereto.

The core via 23 comprises a first opening part 233 in contact with the first surface; a second opening part 234 in contact with the second surface; and a minimum inner diameter part 235 having the smallest inner diameter in the entire core via which is connecting the first opening part 233 and the second opening part 234.

The glass substrate 21 functions as an intermediate role or an intermediary role for connecting the semiconductor element unit 30 and the motherboard 10 to the upper and lower parts thereof, respectively. The core via 23 serves as a passage for transmitting electrical signals thereof, thereby facilitating signal transmission.

The thickness of the electrically conductive layer measured at the larger one between the first opening part and the second opening part by diameter may be equal to or greater than the thickness of the electrically conductive layer formed at the minimum inner diameter part.

The core distribution layer 24 is electrically conductive layers placed on the glass substrate 21 and may have a cross-cut adhesion test value according to ASTM D3359 of 4B or greater, and specifically may have the cross-cut adhesion test value of 5B or greater. Also, the electrically conductive layer which is the core distribution layer 24, may have an adhesive strength of 3 N/cm or more and an adhesive strength of 4.5 N/cm or more with respect to the glass substrate 21. Therefore, when such a degree of adhesive strength is applied, the packaging substrate may have a sufficient adhesive strength between the substrate and the electrically conductive layer.

An upper layer 26 is disposed on the first surface 213.

The upper layer 26 may comprise an upper distribution layer 25, and an upper surface connection layer 27 disposed on the upper distribution layer 25. The uppermost surface of the upper layer 26 may be protected by a cover layer 60 having an opening part capable of being in direct contact with a connecting electrode of the semiconductor element unit disposed thereon.

The upper distribution layer 25 comprises an upper insulating layer 253 disposed on the first surface and an upper distribution pattern 251 that has a predetermined pattern, and that is built in the upper insulating layer 253 as an electrically conductive layer having at least a part electrically connected to the core distribution layer 24.

Any insulating layer may be applied as the upper insulating layer 253 as long as the insulating layer is applied to a semiconductor element or a packaging substrate. Thus, for example, an epoxy resin containing fillers or the like may be applicable, but the embodiment is not limited thereto.

The insulating layer may be formed by forming a coating layer and then hardening, or may be formed by laminating an un-hardened or semi-hardened insulating film on the core layer and then hardening. In this case, when reduced pressure lamination or the like is applied, the insulating material is embedded into a space inside the core via, thereby allowing for efficient process progression. Also, when plural insulating layers are stacked, it may be difficult to substantially distinguish them between the insulating layers. Therefore, the plural insulating layers may be collectively referred to as an upper insulating layer. Also, the core insulating layer 223 and the upper insulating layer 253 may be made of the same insulating material. In this case, the boundary therebetween may not be substantially determined.

The upper distribution pattern 251 is electrically conductive layers disposed in the upper insulating layer 253 in a predetermined pattern, and may be formed through a build-up layer procedure. In detail, the upper distribution pattern 251 in which an electrically conductive layer is vertically or horizontally formed in a desired pattern may be formed by repeating a process of forming an insulating layer, removing an undesirable part of the insulating layer, and then forming an electrically conductive layer through copper plating or the like; removing optionally an undesirable part of the electrically conductive layer and then forming an insulating layer on this electrically conductive layer; and removing an undesirable part and then forming an electrically conductive layer through plating or the like.

Since the upper distribution pattern 251 is disposed between the core layer 22 and the semiconductor element unit 30, the upper distribution pattern 251 is formed to have a fine pattern at least partially. Therefore, the transmission of electrical signals to the semiconductor element unit 30 may proceed smoothly, and a desired complicated pattern may be sufficiently accommodated. In this case, the fine pattern may have a width and spacing of less than 4 µm, 3.5 µm or less, 3 µm or less, 2.5 µm or less, or 1 µm to 2.3 µm, respectively (hereinafter the description of the fine pattern is the same).

In order to form the upper distribution pattern 251 to comprise a fine pattern, at least two methods are applied in the embodiments.

One method is to apply a glass substrate 21 as a supporting substrate of the packaging substrate. For example, the glass substrate 21 could have a considerably flat surface property with a surface roughness (Ra) being 10 angstroms or less. Thereby, the influence of the surface morphology of a supporting substrate on the formation of a fine pattern can be minimized.

The other method is based on the properties of an insulating layer. As the insulating layer, a filler component may be applicable in addition to resin, and inorganic particles such as silica particles may be applicable as the filler. When the inorganic particles are applied to the insulating layer as the filler, the size of the inorganic particles can affect whether to form the fine pattern. Therefore, particle type fillers with an average diameter of 150 nm or less are applied as the insulating layer in one or more embodiments. In one example, particle type fillers with an average diameter of 1 nm to 100 nm may be comprised in an insulating layer. The above properties can minimize the influence of the insulating layer itself on the formation of an electrically conductive layer with a width of several micrometers or below while maintaining the desired properties of the insulating layer at a certain level or more. Further, it can also help form a fine pattern with good adhesion onto the surface due to the fine surface morphology.

The upper surface connection layer 27 comprises an upper surface connection pattern 272 and an upper surface connecting electrode 271. The upper surface connection pattern 272 is disposed in the upper insulating layer 253 and partially electrically connected to the upper distribution pattern 251. The upper surface connecting electrode 271 is configured to electrically connect the semiconductor element unit 30 and the upper surface connection pattern 272. The upper surface connection pattern 272 may be disposed on one surface of the upper insulating layer 253 or may be embedded with at least a part thereof being exposed on the upper insulating layer 253. For example, the upper insulating layer 253 may be formed through plating or the like when the upper surface connection pattern 272 is disposed on one side of the upper insulating layer 253. Also, the upper insulating layer 253 may be formed by forming a copper plating layer or the like and then partially removing the insulating layer or the electrically conductive layer through surface polishing or surface etching when the upper surface connection pattern 272 is embedded with at least a part thereof being exposed to the upper insulating layer 253.

The upper surface connection pattern 272 may at least partially comprise a fine pattern like the above-described upper distribution pattern 251. The upper surface connection pattern 272 comprising the fine pattern may enable a plurality of elements to be electrically connected to one another even in a narrow area, facilitate an electrical signal connection between elements or with the outside, and this allows to achieve more integrated packaging.

The upper surface connecting electrode 271 may be connected to the semiconductor element unit 30 directly through a terminal or may be connected via an element connection unit 51 such as a solder ball.

The packaging substrate 20 is also connected to the motherboard 10. The motherboard 10 may be directly connected to the second surface distribution pattern 241c, which is a core distribution layer disposed on at least a part of the second surface 214 of the core layer 22, through a motherboard terminal or may be electrically connected to the second surface distribution pattern 241c via a board connection unit such as a solder ball. Also, the second surface distribution pattern 241c may be connected to the motherboard 10 through the lower layer 29 disposed under the core layer 22.

The lower layer 29 comprises a lower distribution layer 291 and a lower surface connection layer 292.

The lower distribution layer 291 comprises i) a lower insulating layer 291b in partial contact with the second surface 214; and ii) a lower distribution pattern 291a connected to the core distribution layer at least partially electrically, wherein the lower distribution pattern 291*a* is embedded in the lower insulating layer 291*b* and having a predetermined pattern.

The lower surface connection layer 292 comprises i) a lower surface connecting electrode 292*a* electrically connected to the lower surface connection pattern and may further comprise ii) a lower surface connection pattern 292*b* connected to the lower distribution pattern 291*a* at least partially electrically and exposed to one surface of the lower insulating layer 291*b* at least partially.

The lower surface connection pattern 292*b*, which is connected to the motherboard 10, may be formed as a non-fine pattern having wider width than that of the fine pattern, unlike the upper surface connection pattern 272, and thereby efficient electrical signals transmit may be achieved.

One feature of the embodiments is that substantially an additional substrate other than the glass substrate 21 is not applied to the packaging substrate 20 disposed between the semiconductor element unit 30 and the motherboard 10.

Conventionally, an interposer and an organic substrate were stacked between the element and the motherboard. It is considered that such a multi-stage form has been applied for at least two reasons. One reason is that there is a scale mismatch when directly bonding fine patterns of the element to the motherboard. The other reason is that damage at distribution wires may occur due to a difference in thermal expansion coefficient during the bonding process or during the driving process of the semiconductor element. One or more embodiments have solved the above problems by applying a glass substrate having a similar thermal expansion coefficient to that of the semiconductor element and by fabricating a fine pattern with a fine scale enough to mount the elements on the first surface of the glass substrate and an upper layer thereof.

The thickness of thinner one among the electrically conductive layers of the core distribution layer 24 according to one or more embodiments may be the same as or greater than the width of the thinner one among the electrically conductive layers of the upper layer 26 (Tus). When the thickness of thinner one among the electrically conductive layers of the core distribution layer 24 is the same as or greater than the thickness of thinner one among the electrically conductive layers of the upper layer 26, electrical signal transmittance may be made more efficient between an element and a motherboard.

The thickness of thinner one among the electrically conductive layers of the core distribution layer 24 according to one or more embodiments may be the same as or greater than the thickness of thinner one among the electrically conductive layers of the upper layer 26 (Tus). When the thickness of thinner one among the electrically conductive layers of the core distribution layer 24 is the same as or greater than the thickness of thinner one among the electrically conductive layers of the upper layer 26, electrical signal transmittance may be made more efficient between an element and a motherboard.

A thickness of the electrically conductive layer at the minimum inner diameter part of the core via 23 may be the same as or greater than the width of the thinner one among the electrically conductive layers of the upper layer 26. When the thickness of the electrically conductive layer at the minimum inner diameter part is the same as or greater than the width of thinner one among the electrically conductive layers of the upper layer, electrical signal transmittance may be made more efficient between an element and a motherboard.

A thickness of the electrically conductive layer at the minimum inner diameter part of the core via 23 may be the same as or greater than the thickness of the thinner one among the electrically conductive layers of the upper layer 26. When the thickness of the electrically conductive layer at the minimum inner diameter part is the same as or greater than the thickness of thinner one among the electrically conductive layers of the upper layer, electrical signal transmittance may be made more efficient between an element and a motherboard.

The average thickness of the core distribution pattern 241 according to one or more embodiments may be thicker than the width of thinner one within the upper surface connection pattern 272 (Wus) by one to twenty times, or one to fifteen times. Also, the core distribution pattern 241 may have an average thickness greater by one to ten times or one to eight times based on the width of the thinner one within the upper surface connection pattern 272 (Wus). When a core distribution pattern 241 having such a ratio is applied to the packaging substrate, a process of connecting electrical signals to a motherboard from a highly integrated element can be made more efficient.

The average thickness of the core distribution pattern 241 (Tcv) according to one or more embodiments may be thicker than the thickness of thinner one within the upper surface connection pattern 272 (Tus) by seven tenth to twelve times, or one to ten times. Also, the core distribution pattern 241 may have a thicker thickness (Tcv) by one and a tenth to eight times, one and a tenth to six times, or one and a tenth to three times based on the thickness of thinner one within the upper surface connection pattern 272 (Tus). When the core distribution pattern 241 has such a thickness ratio, a process of connecting electrical signals to a motherboard from a highly integrated element can be made more efficient.

The average thickness of the core via distribution pattern 241*b*, which is a core distribution pattern disposed at the inner diameter surface of the core via according to the exemplary embodiment, may be greater by one to twelve times, or one to ten times based on the width of thinner one within the upper surface connection pattern 272 (Wus). Also, the average thickness of the core via distribution pattern 241*b* may be greater by one to eight times or one to six times based on the width of the thinner one within the upper surface connection pattern 272 (Wus). Therefore, when a core via distribution pattern 241*b* having such an average thickness ratio is applied to the packaging substrate, a process of connecting electrical signals to a motherboard from a highly integrated element can be made more efficient.

The core distribution pattern 241 may comprise a form comprising an electrically conductive layer of a uniform thickness disposed at the inner diameter part of core vias in the manner illustrated in drawings, and comprise insulating layers occupying the rest. Or, the core distribution pattern 241 may comprise electrically conductive layers occupying all the space of core vias without remaining space, as required. When electrically conductive layers occupy the space of core vias in this manner, a distance from the one side of the core via pattern close to the inner diameter surface to the center of the electric conductive layer is designated as the width of the core via pattern (Same as below).

Within the core distribution pattern 241, according to the exemplary embodiments, the thinner one may have a thickness (Tcv) that is greater by eight tenths to ten times, or eight tenths to seven times based on a width of thinner one (Wus). Also, within the core distribution pattern 241, thinner one may have a thickness (Tcv) greater by nine tenths to six times, or one to four times based on a width of thinner one (Wus). Therefore, when the core distribution pattern 241 with such a thickness ratio is applied, a process of connecting electrical signals to a motherboard from a highly integrated element can be made more efficient.

Within the second surface distribution pattern 241c, according to the exemplary embodiments, thicker one may have a wiring thickness (Tsc) which is greater by seven tenth to twenty times, or seven tenths to fifteen times based on the thickness of thinner one within the upper surface connection pattern 272. Also, the second surface distribution pattern 241c may have a wiring thickness (Tsc) that is greater by one to twelve times, or one and a tenth to five times based on the thickness of the thinner one within the upper surface connection pattern 272. When the second surface distribution pattern 241c has such a wiring thickness, a process of connecting electrical signals to a motherboard from a highly integrated element can be made more efficient.

Within the second surface distribution pattern 241c according to the exemplary embodiment, the width of thicker one (Wsc) may be greater by one to twenty times, or one to fifteen times based on the width of thinner one within the upper surface connection pattern 272 (Wus). Also, within the second surface distribution pattern 241 according to the exemplary embodiment, the width of thicker one (Wsc) may be greater by two to ten times, or two to eight times based on the width of thinner one within the upper surface connection pattern 272 (Wus). Thus, when a second surface distribution pattern 241c having such a ratio is applied, a process of connecting electrical signals to a motherboard from a highly integrated element can be made more efficient.

Within the lower surface connection pattern 292b, according to the exemplary embodiment, the width of thicker one (Wds) may be greater by one to twenty times, or one to fifteen times based on the width of thinner one within the upper surface connection pattern 272 (Wus). Also, within the lower surface connection pattern 292b, the width of thicker one (Wds) may be greater by two to ten times, or two to eight times based on the width of thinner one within the upper surface connection pattern 272 (Wus). Thus, when a lower surface connection pattern 292b with such a width ratio is applied, a process of connecting electrical signals to a motherboard from a highly integrated element can be made more efficient.

Within the lower surface connection electrode 292a, according to the exemplary embodiment, the width of thicker one (not shown) may be greater by seven tenths to thirty times, or eight tenth to twenty times based on the width of thinner one within the upper surface connection pattern 272 (Wus). Within the lower surface connection electrode 292a, the width of the thicker one (not shown) may be greater by one to fifteen times, or one to ten times based on the width of the thinner one within the upper surface connection pattern 272. At least some of the lower surface connection patterns 292b according to one or more embodiments may have a thickness (Tds) which is greater by seven tenths to thirty times, one to twenty-five times, or one and five tenth to twenty times based on the thickness of thinner one among the upper surface connection patterns 272 (Tus). When a lower surface connection electrode 292a having such a width ratio is used, a process of connecting electrical signals to a motherboard from a highly integrated element can be made more efficient.

It is possible to make the overall thickness of the semiconductor apparatus 100 thinner by the semiconductor apparatus 100 having a considerably thin packaging substrate 20, and it is also possible to position a desired electrical connection pattern even in a small area by applying the fine pattern. In detail, the packaging substrate 20 may have a thickness of 2000 μm or less, 1500 μm or less, or about 900 μm. Also, the packaging substrate 20 may have a thickness of 120 μm or more or 150 μm or more. Due to the above-described characteristics, the packaging substrate can electrically and structurally connect the element and the motherboard stably even with a relatively thin thickness, thereby contributing to miniaturization of the semiconductor apparatus relating to the surface area and thickness.

A resistance value of the packaging substrate 20 cut in about a size of 100 μm×100 μm based on the upper surface thereof may be $2.6 \times 10^{-6} \Omega$ or more, $3.6 \times 10^{-6} \Omega$ or more, or $20.6 \times 10^{-6} \Omega$ or more. A resistance value of the packaging substrate may be $27.5 \times 10^{-6} \Omega$ or less, $25.8 \times 10^{-6} \Omega$ or less, or $24.1 \times 10^{-6} \Omega$ or less. For example, the resistance value is obtained by measuring the resistance between an electrically conductive layer of an upper layer and an electrically conductive layer of a lower layer that are cut in a certain size described in the above, and the resistance value is measured by connecting the electrically conductive layer of the upper layer and the electrically conductive layer of the lower layer from each other. The resistance value may be measured by a method described in below experimental examples. A packaging substrate satisfying the resistance value can transmit electrical signals easily to the external.

Figure 6:
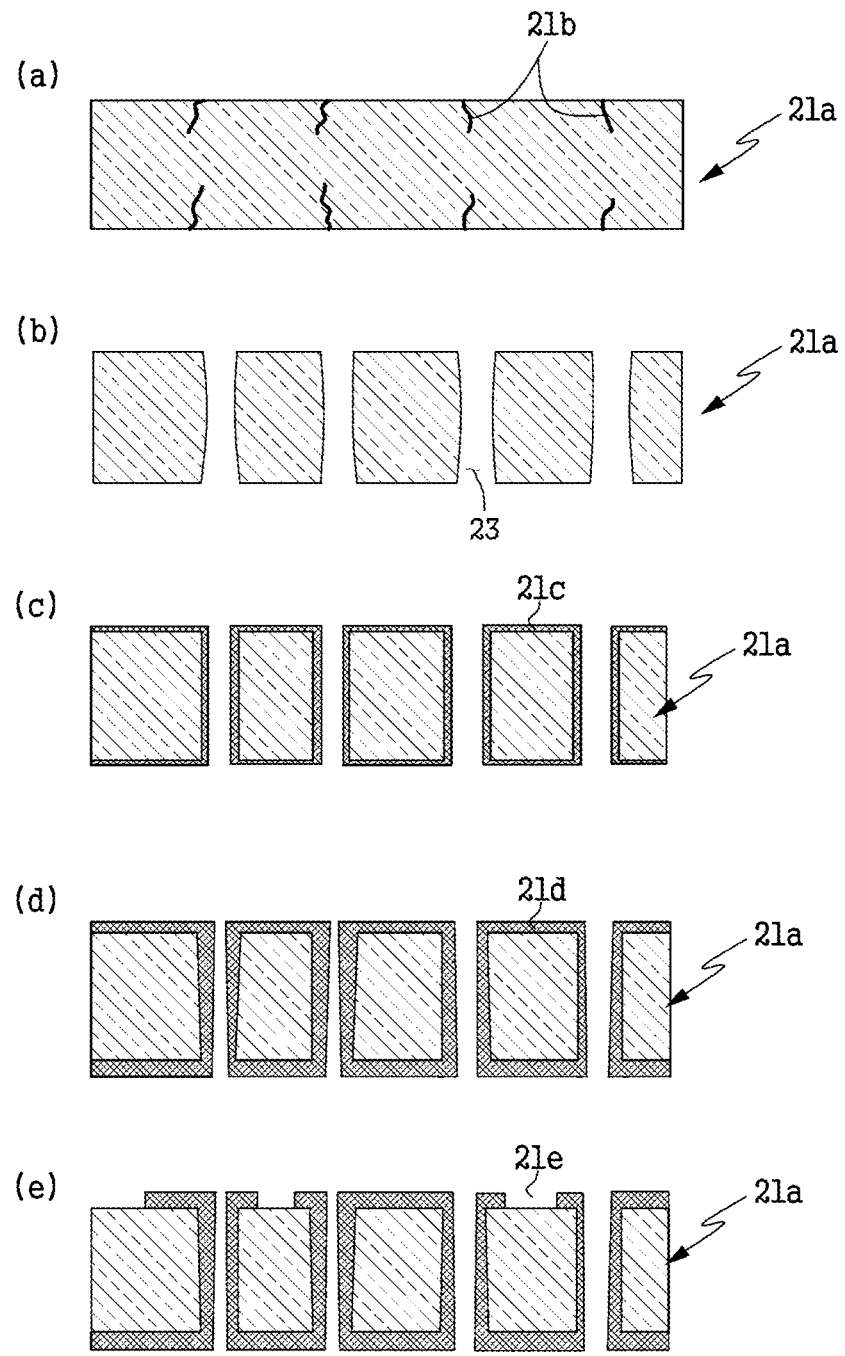
FIGS. 6 to 8 are flowcharts illustrating a process of manufacturing a packaging substrate by using cross-sections thereof according to an embodiment.
Figure 7:
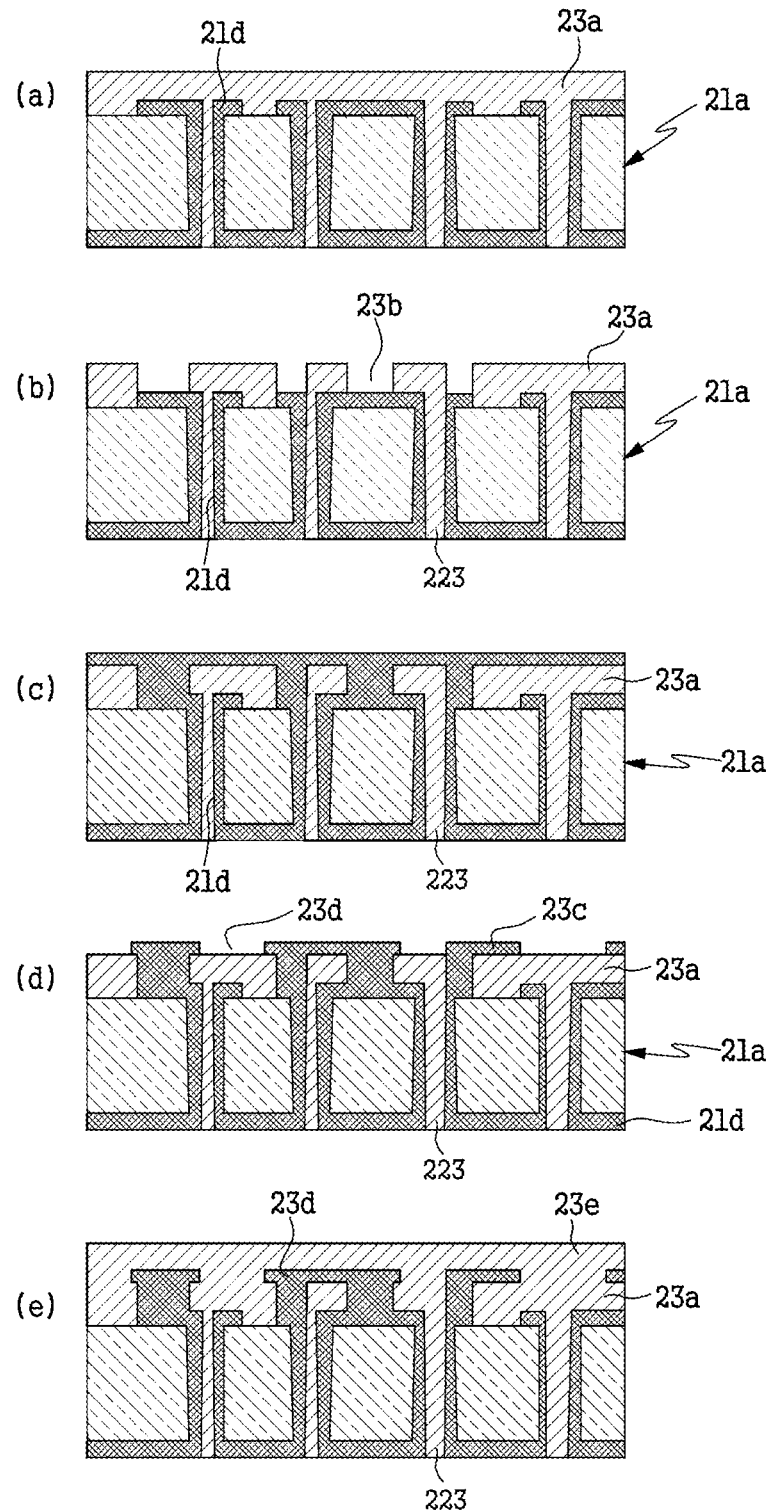
Figure 8:
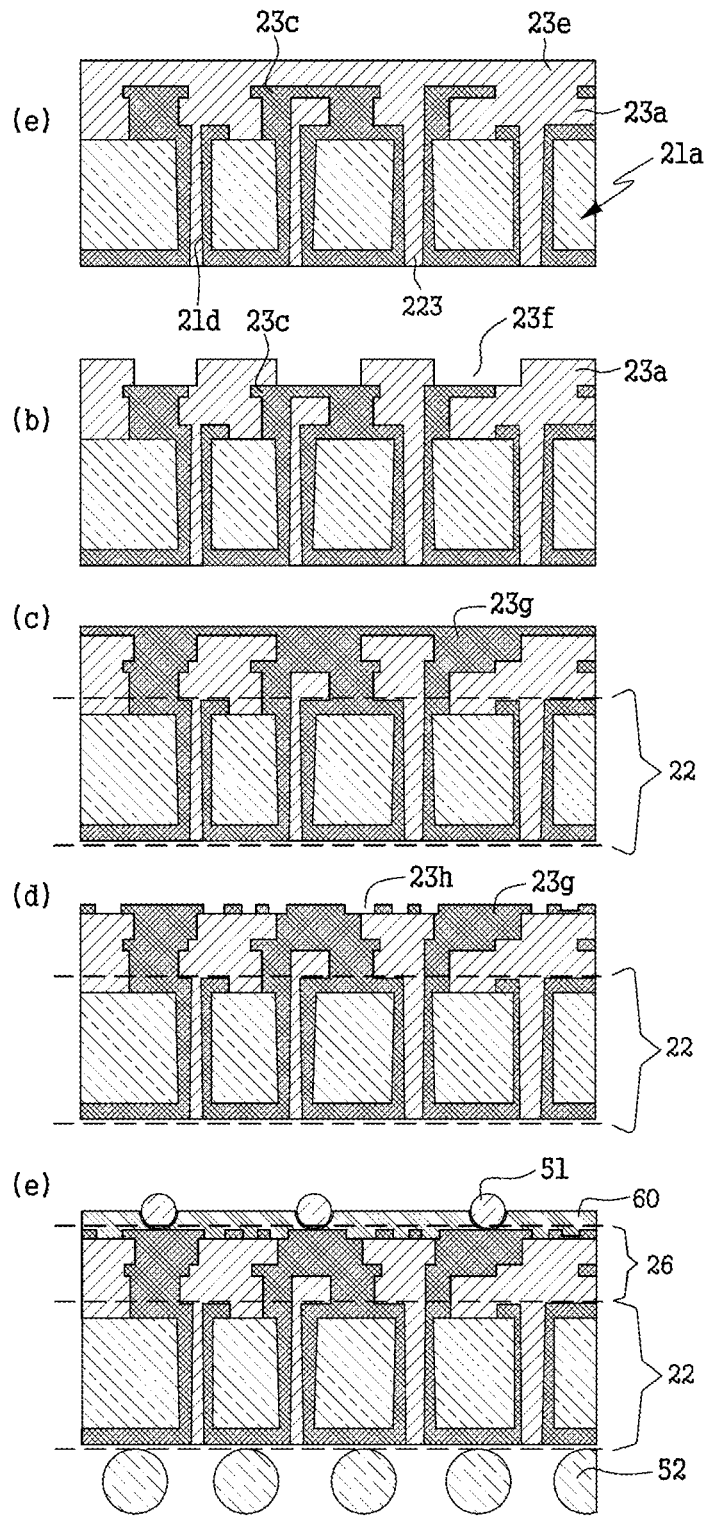

FIGS. 6 to 8 are flowcharts for illustrating a process of manufacturing a packaging substrate by cross-sections thereof according to an exemplary embodiment. A method of manufacturing the packaging substrate according to another embodiment will be described below with reference to FIGS. 6 to 8.

The method of manufacturing the packaging substrate of one or more embodiments comprises a preparation operation of forming a defect at predetermined positions of a first surface and a second surface of a glass substrate; an etching operation of applying an etchant to the glass substrate where the defect is formed to provide a glass substrate with a core via formed thereon; a core layer forming operation of plating the surface of the glass substrate with the core via formed thereon to form a core distribution layer, which is an electrically conductive layer, and thus form a core layer; and an upper layer forming operation of forming an upper distribution layer, which is an electrically conductive layer and surrounded by an insulating layer, on one side of the core layer.

The core layer forming operation may comprise a pretreatment process in which an organic/inorganic composite primer layer comprising nanoparticles having amine groups is formed on the surface of the glass substrate having the core via formed thereon to prepare a pre-processed glass substrate, and a plating process in which a metal layer is plated on the pre-processed glass substrate.

The core layer forming operation may comprise a pretreatment process in which a metal-containing primer layer is formed on the surface of the glass substrate having the core via formed thereon through sputtering to prepare a pre-processed glass substrate, and a plating process in which a metal layer is plated on the pre-processed glass substrate.

An insulating layer forming operation may be further comprised between the core layer forming operation and the upper layer forming operation.

The insulating layer forming operation may be an operation of positioning an insulating film on the core layer and performing reduced pressure lamination to form a core insulating layer.

The method of manufacturing the packaging substrate will be described in more detail.

1) Preparation Operation (Glass Defect Forming Process): A glass substrate 21a having flat first and second surfaces is prepared. A defect (hole) 21b is formed at a predetermined position on the surface of the glass substrate to prepare a core via forming operation. As the glass substrate, a glass substrate applied to a substrate of an electronic apparatus or the like may be applicable. For example, a non-alkali glass substrate may be applicable, but one or more embodiments are not limited thereto. As commercially available products, products manufactured by manufacturers such as Corning Inc., Schott AG, and AGC Inc. may be applicable. In order to form the defect (hole), mechanical etching, laser irradiation, or the like may be applicable.

2) Etching Operation (Core Via Forming operation): The glass substrate 21a having the defect (hole) 21b with thereon forms a core via 23 through a physical or chemical etching process. During the etching process, the glass substrate 21a may form a core via (through via) at the defective part, and also the surface of the glass substrate 21a may be etched at the same time. A masking film may be applicable in order to prevent the surface of the glass substrate from being etched, but the glass substrate itself with the defect may be etched in consideration of any inconvenience caused by a process of applying and removing the masking film. In this case, the glass substrate having the core via may be somewhat thinner than the initial glass substrate.

3-1) Core Layer Forming Operation: An electrically conductive layer 21d is formed on the glass substrate. As a representative example of the electrically conductive layer, a metal layer containing copper metal may be applicable, but one or more embodiments are not limited thereto.

The surface of the glass (comprising the surface of the glass substrate and the surface of the core via) and the surface of copper metal have different characteristics and thus are less adhesive. In the exemplary embodiment, the adhesive strength between the glass surface and the metal is improved by two methods, i.e., a dry method and a wet method.

The dry method is a method applying sputtering, that is, a method of forming a seed layer 21c inside the core via and on the glass surface through metal sputtering. During the formation of the seed layer, other metals such as titanium, chromium, and nickel may be sputtered together with copper or the like. In this case, it is considered that glass-metal adhesion is improved by the anchor effect, i.e., in which the surface morphology of the glass and the metal particles interact with each other.

The wet method is a method applying primer treatment, that is, a method of forming a primer layer 21c by performing pre-treatment with a compound having a functional group such as amine. Depending on the desired degree of adhesive strength, after pre-treatment with a silane coupling agent, the primer treatment may be performed with a compound or particle having an amine functional group. As described above, it is desirable for the supporting substrate of one or more embodiments to have a high performance enough to form a fine pattern, and the high performance should be maintained even after the primer treatment. Accordingly, when such a primer contains nanoparticles, it is preferable that nanoparticles having an average diameter of 150 nm or less are applied. For example, it is preferable that nanoparticles are applied as particles having amine functional groups. The primer layer may be formed by applying, for example, an adhesive strength improving agent manufactured in CZ series by MEC Inc.

In the seed layer/primer layer 21c, an electrically conductive layer, i.e., a metal layer, may be selectively formed with or without removing a part where the formation of the electrically conductive layer is undesirable. Also, in the seed layer/primer layer 21c, a subsequent process may be performed after a part where the formation of the electrically conductive layer is desirable or a part where the formation of the electrically conductive layer is undesirable is selectively processed such that the part becomes activated or deactivated for metal plating. For example, light irradiation treatment such as laser light of a certain wavelength, chemical treatment, or the like may be applied to process activation or deactivation. A copper plating method or the like applied for manufacturing a semiconductor element may be applied to form the metal layer, but one or more embodiments are not limited thereto.

During the metal plating, the thickness of the electrically conductive layer may be regulated by regulating several variables such as the concentration of a plating solution, a plating time, and the type of additive applied.

When a part of the core distribution layer is undesirable, the part may be removed. An etching layer of the core distribution layer 21e may form an electrically conductive layer in a predetermined pattern by performing metal plating after partially removing or deactivating the seed layer.

3-2) Insulating Layer Forming Operation: An insulating layer forming operation may be performed in which an empty space of a core via is filled with an insulating layer after the core distribution layer, which is the electrically conductive layer, is formed. In this case, the insulating layer as a film type may be applied. For example, the film-type insulating layer may be applied through reduced pressure lamination or the like. When the reduced pressure lamination is performed, the insulating layer may be sufficiently embedded into the empty space inside the core via to form a core insulating layer with reducing the possibility of forming a void defect.

4) Upper Layer Forming Operation: An upper distribution layer comprising an upper insulating layer and an upper distribution pattern is formed on the core layer. The upper insulating layer may be formed by coating a resin composition forming an insulating layer 23a or stacking an insulating film. Simply, the stacking of the insulating film is preferable. The stacking of the insulating film may be performed by laminating and hardening the insulating film. In this case, when reduced pressure lamination is applied, an insulating resin may be sufficiently embedded even into an empty part where the electrically conductive layer is not formed inside the core via. The upper insulating layer is at least partially in direct contact with the glass substrate, and thus provides sufficient adhesion. In detail, the glass substrate and the upper insulating layer may have an adhesion test value of 4 dB or more as according to ASTM D3359.

The upper distribution pattern may be formed by repeating a process of forming the insulating layer 23a, forming an electrically conductive layer 23c in a predetermined pattern, and etching an undesirable part to form an etching layer 23d of the electrically conductive layer. An electrically conductive layer formed adjacent to each other with the insulating layer interposed therebetween may be formed by forming a blind via 23b on the insulating layer and then performing a plating process. A dry etching method such as laser etching and plasma etching, and the like, a wet etching method using a masking layer and an etching solution, and the like may be applied to form the blind via.

5) Upper Surface Connection Layer and Cover Layer Forming Operation: An upper surface connection pattern and an upper surface connecting electrode may be formed similarly to the formation of the upper distribution layer. In detail, the upper surface connection pattern and the upper surface connecting electrode may be formed by forming an etching layer 23f of an insulating layer 23e on the insulating layer 23e, forming an electrically conductive layer 23g, and then forming an etching layer 23h of the electrically conductive layer. However, a method of selectively forming only the electrically conductive layer may be applied without the etching. A cover layer may be formed to have an opening part (not shown) at a position corresponding to the upper surface connecting electrode such that the upper surface connecting electrode is exposed and directly connected to an element connection unit, a terminal of an element, or the like.

6) Lower Surface Connection Layer and Cover Layer Forming Operation: A lower distribution layer and/or a lower surface connection layer, and optionally a cover layer (not shown) may be formed similarly to the above-described formation of the upper surface connection layer and the cover layer.

Below example embodiments are just examples for helping to understand the subject application, and the range of one or more embodiments are not limited thereto.

Manufacturing Example 1—Manufacture of Packaging Substrate

1) Preparation Operation (Glass Defect Forming Process): A glass substrate 21a having flat first and second surfaces was prepared, and a defect (hole) 21b was formed at a predetermined position on the surface of the glass substrate in order to form a core via. As the glass substrate, borosilicate glass (Corning®) was used. In order to form the defect (hole), mechanical etching and laser irradiation were applied.

2) Etching Operation (Core Via Forming Operation): On the glass substrate 21a having the defect (hole) 21b with thereon, a core via 23 was formed through a physical or chemical etching process.

3-1) Core Layer Forming Operation: An electrically conductive layer 21d was formed on the glass substrate. As for the electrically conductive layer, a metal layer containing copper metal was used. The adhesive strength between the surface of the glass substrate and the metal was improved by two methods, i.e., a dry method and a wet method. The dry method applies sputtering, that is, a method of forming a seed layer 21c inside the core via and on the glass surface through metal sputtering. During the formation of the seed layer, any one or more of other metals such as titanium, chromium, and nickel was sputtered together with copper or the like. The wet method is a method applying primer treatment, that is, a method of forming a primer layer 21c by performing pre-treatment with a compound having a functional group such as amine. After pre-treatment by using a silane coupling agent, primer treatment was done with a compound or particles having an amine functional group. Such a primer comprises nanoparticles having an average diameter of 150 nm or less, and nanoparticles were applied to the particles having an amine group. The primer layer was formed by applying an adhesive strength improving agent manufactured in CZ series by MEC Inc.

In the seed layer/primer layer 21c, a part where the formation of the electrically conductive layer is desirable or a part where the formation of the electrically conductive layer is undesirable was selectively processed to be an activated state or an inactivated state for metal plating. The processing to be an activated state or an inactivated state was performed by using light irradiation treatment such as laser light of a certain wavelength, chemical treatment, or the like. A copper plating method or the like applied for manufacturing a semiconductor element was applied to form the metal layer.

After the seed layer was partially removed or processed to be inactivated, metal plating was performed to form an electrically conductive layer of a predetermined pattern, and thereby, an etching layer 21e of a core distribution layer was formed.

3-2) Insulating Layer Forming Operation: An insulating layer forming operation was performed in which an empty space of a core via was filled with an insulating layer after the core distribution layer as the electrically conductive layer was formed. In this case, the insulating layer manufactured in a film type was applied, and the film-type insulating layer was applied through reduced pressure lamination.

4) Upper Layer Forming Operation: A operation for forming an upper distribution layer comprising an upper insulating layer and an upper distribution pattern on a core layer was performed. The upper insulating layer was formed by stacking insulating films, and the insulating films were laminated and hardened as the process. A layer in direct contact with a glass substrate from at least a part, thereby having a sufficient adhesive strength, was also applied as the upper insulating layer. In detail, the glass substrate and the upper insulating layer that were applied had a characteristic satisfying an adhesion test value of 4 dB or more as according to ASTM D3359.

The upper distribution pattern was formed by repeating a process of forming the insulating layer 23a, forming an electrically conductive layer 23c to have a predetermined pattern, and forming an etching layer 23d of the electrically conductive layer by etching the undesirable portion. In a case of electrically conductive layers formed to neighbor with having an insulating layer placed therebetween, the electrically conductive layers were formed by a method of performing a plating process after a blind via 23b was formed on the insulating layer. For formation of the bind via, a dry etching method such as laser etching and plasma etching, and a wet etching method using a masking layer and an etching solution were applied.

5) Upper Surface Connection Layer and Cover Layer Forming Operation: A process was performed by a method of forming an etching layer 23f of an insulating layer 23e on the insulating layer 23e, forming an electrically conductive layer 23g on the etching layer, and then forming an etching layer 23h of the electrically conductive layer. A cover layer was formed to have an opening part (not shown) at a position corresponding to the upper surface connecting electrode such that the upper surface connecting electrode was exposed and directly connected to an element connection unit, a terminal of an element, or the like.

In this time, the thickness of thinner one among electrically conductive layers inside the core via formed in the above 3-1) operation (Tcv) and the width of a thinner one within the upper distribution pattern and an upper connection layer (Wus) were set to have a ratio of 1:1, and the thickness (Tcv) and the thickness of thinner one within the upper distribution pattern and a pattern of the electrically conductive layers formed in the above 4) and 5) operations was set to have a ratio of 1:07.

6) Lower Surface Connection Layer and Cover Layer Forming Operation: A lower distribution layer and/or a lower surface connection layer and optionally a cover layer (not shown) were formed similarly to the above-described forming operation of the upper surface connection layer and the cover layer, and thereby a packaging substrate.

The packaging substrate 20 manufactured by the above method comprises,
- a core layer comprising a glass substrate 21 having a first surface and a second surface facing each other, a core via 23 penetrating the glass substrate in a thickness direction and disposed in a plural number, and a core distribution layer 24 disposed on a surface of the glass substrate or a surface of the core via and having electrically conductive layers at least partially configured to connect electrically conductive layers of the first and second surfaces electrically through the core vias; and
- an upper layer 26, disposed on the first surface, and comprising an electrically conductive layer which electrically connects the core distribution layer and an external semiconductor element unit;
- wherein the upper layer comprises an upper distribution layer 25 and an upper surface connection layer 27 disposed on the upper distribution layer,
- the upper distribution layer comprises an upper insulating layer 253 disposed on the first surface; an upper distribution pattern 251, which is electrically conductive layers electrically connected to the core distribution layer 24 at least partially and embedded in the upper insulating layer 24, and
- the core via comprises a first opening part 233 in contact with the first surface; a second opening part 234 in contact with the second surface; and a minimum inner diameter part 235, which is an area having the narrowest inner diameter within the entire core via connecting the first opening part and the second opening part,
- wherein a ratio of the thickness of thinner one among electrically conductive layers of the core distribution layer (Tcv) and the width of thinner one among electrically conductive layers of the upper layer (Wus) is 1:1, and
- a ratio of the thickness of thinner one among electrically conductive layers of the core distribution layer (Tcv) and the thickness of thinner one among electrically conductive layers of the upper layer (Tus) is 0.7:1.

Manufacturing Example 2—Manufacture of Packaging Substrate

A semiconductor apparatus was manufactured by the same method as the manufacturing example 1 excepting for setting a ratio of the thickness of thinner one among electrically conductive layers of the core distribution layer (Tcv) and the width of thinner one among electrically conductive layers of the upper layer (Wus) to be 12:1, and
   setting a ratio of the thickness of thinner one among electrically conductive layers of the core distribution layer (Tcv) and the thickness of thinner one among electrically conductive layers of the upper layer (Tus) to be 12:1 in the packaging substrate of the manufacturing example 1.

Manufacturing Example 3—Manufacture of Packaging Substrate

A semiconductor apparatus was manufactured by the same method as the manufacturing example 1 excepting for setting a ratio of the thickness of thinner one among electrically conductive layers of the core distribution layer (Tcv) and the thickness of thinner one among electrically conductive layers of the upper layer (Tus) to be 0.5:1 in the packaging substrate of the manufacturing example 1.

Manufacturing Example 4—Manufacture of Packaging Substrate

A semiconductor apparatus was manufactured by the same method as the manufacturing example 1 excepting for setting a ratio of the thickness of thinner one among electrically conductive layers of the core distribution layer (Tcv) and the width of thinner one among electrically conductive layers of the upper layer (Wus) to be 12:1, and setting a ratio of the thickness of thinner one among electrically conductive layers of the core distribution layer (Tcv) and the thickness of thinner one among electrically conductive layers of the upper layer (Tus) to be 13:1 in the packaging substrate of the manufacturing example 1.

Experimental Example—Measurement of Electrical Properties

The packaging substrate of the manufacturing examples 1 to 4 was cut in a size of 100 μm×100 μm based on the upper surface thereof, the resistance value among electrical properties thereof was measured through a resistivity measuring apparatus, other conditions except for the above conditions of the thickness (Tcv and Tus) and width (Wus) were set to be the same, and the result was shown in Table 1.

TABLE 1

|  | Example 1 | Example 2 | Example 3 | Example 4 |
|---|---|---|---|---|
| Tcv:Wus | 1:1 | 12:1 | 1:1 | 12:1 |
| Tcv:Tus | 0.7:1 | 12:1 | 0.5:1 | 13:1 |
| Bulk Resistance value (Ω) | $3.6 \times 10^{-6}$ | $20.6 \times 10^{-6}$ | $2.6 \times 10^{-6}$ | $22.4 \times 10^{-6}$ |

Tcv: The thickness of thinner one among electrically conductive layers of a core distribution layer
Wus: The width of thinner one among electrically conductive layers of an upper layer
Tus: The width of thinner one among electrically conductive layers of an upper layer With reference to the above Table 1, manufacturing examples 1 and 2 that have a ratio of 1:1 to 12:1 for the thickness of thinner one among electrically conductive layers of the core distribution layer (Tcv) and the width of thinner one among electrically conductive layers of the upper layer (Wus), and have a ratio of 0.7:1 to 12:1 for the above thickness (Tcv) and the thickness of thinner one among electrically conductive layers of the upper layer (Tus), show a good resistance value of $3.6 \times 10^{-6}$ to $20.6 \times 10^{-6}$ It is considered that a packaging substrate having such a characteristic can transmit electrical signals to elements arranged thereon or thereunder sufficiently harmoniously.

A packaging substrate of the example embodiments has excellent properties such as not generating a parasitic element effect of a glass substrate, functioning as a substrate supporter having a sufficient strength with being thin, and the like, and therefore utilizes the excellent properties like inducing efficient signal transmission by forming an electrically conductive layer in a proper width and thickness inside the glass substrate.

When the diameter of a core via formed in a glass substrate is too small, it may be difficult to form electrically conductive layers sufficiently inside the core via, and it may not be sufficiently harmonious to transmit electrical signals to upper and lower parts of the packaging substrate.

When the diameter of a core via is too large, it may not be desirable to fill all the inside of the core via with electrically conductive layers or may generate void easily. Also, when a core via with an excessively large diameter is formed in a high density, it may be difficult to maintain mechanical properties of the glass substrate itself in a certain level or more.

For efficient transmission of electrical signals with considering the above characteristics, it is thought to be preferable that the ratio of the thickness of thinner one among electrically conductive layers of the core distribution layer (Tcv) and the width of thinner one among electrically conductive layers of the upper layer (Wus) is 1:1 to 12:1, and the ratio of the above thickness (Tcv) and the thickness of thinner one among electrically conductive layers of the upper layer (Tus) is 0.7 to 12:1.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor apparatus comprising:
    a semiconductor element unit comprising one or more semiconductor elements;
    a packaging substrate, connected to the semiconductor elements, comprising a core layer and an upper layer disposed on the core layer, the core layer comprising a glass substrate, a core via, and a core distribution layer disposed on a surface of the glass substrate or a surface of the core via, the glass substrate having a first surface and a second surface facing each other; and
    a motherboard electrically connected to the packaging substrate and configured to transmit electrical signals to the one or more semiconductor elements and to connect the semiconductor elements,
    wherein the core via penetrates through the glass substrate in a thickness direction in a plural number,
    wherein at least a part of the core distribution layer connects electrically conductive layers of the first surface and an electrically conductive layer of the second surface through the core via penetrating through the glass substrate,
    wherein the upper layer is disposed on the first surface and comprises an electrically conductive layer connecting the core distribution layer and an external semiconductor element unit, and
    wherein a thickness of a thinnest layer among the electrically conductive layers of the core distribution layer is the same as or greater than a width of a thinnest layer among the electrically conductive layers of the upper layer.

2. The semiconductor apparatus of claim 1,
    wherein the thickness of the thinnest layer among the electrically conductive layers of the core distribution layer is greater than the width of the thinnest layer among the electrically conductive layers of the upper layer by 1 to 12 times.

3. The semiconductor apparatus of claim 1, further comprising:
    an upper insulating layer and an upper distribution pattern,
    wherein the upper insulating layer is disposed on the first surface,
    the upper distribution pattern at least partially comprising a fine pattern is at least partially connected to the core distribution layer,
    the upper distribution pattern is an electrically conductive layer embedded in the upper insulating layer, and
    the fine pattern has a width of less than 4 μm with an interval of less than 4 μm.

4. The semiconductor apparatus of claim 1,
    wherein the core distribution layer comprises a core distribution pattern comprising a second surface distribution pattern,
    wherein the second surface distribution layer is an electrically conductive layer disposed on the second surface, and
    wherein a width of an electrically conductive layer having a greatest width within the second surface distribution pattern is 1 to 20 times of a width of a thinnest layer among the electrically conductive layers of the upper layer.

5. A packaging substrate comprising:
    a core layer and an upper layer disposed on the core layer, the core layer comprising a glass substrate, a core via, and a core distribution layer disposed on a surface of the glass substrate or a surface of the core via, the glass substrate having a first surface and a second surface facing each other,
    wherein the core via penetrates through the glass substrate in a thickness direction in a plural number,
    wherein at least a part of the core distribution layer connects an electrically conductive layer of the first surface and an electrically conductive layer of the second surface through the core via penetrating through the glass substrate,
    wherein the upper layer is disposed on the first surface and comprises an electrically conductive layer connecting the core distribution layer and an external semiconductor element unit, and
    wherein a thickness of a thinnest layer among electrically conductive layers of the core distribution layer is the same as or greater than a width of a thinnest layer among the electrically conductive layers of the upper layer.

6. A semiconductor apparatus comprising:
    a semiconductor element unit comprising one or more semiconductor elements;
    a packaging substrate, connected to the semiconductor elements, comprising a core layer and an upper layer disposed on the core layer, the core layer comprising a glass substrate, a core via, and a core distribution layer disposed on a surface of the glass substrate or a surface of the core via, the glass substrate having a first surface and a second surface facing each other; and a motherboard connected to the packaging substrate, and configured to transmit electrical signals to the one or more semiconductor elements and to connect the semiconductor elements, wherein the core via penetrates through the glass substrate in a thickness direction in a plural number, wherein at least a part of the core distribution layer connects an electrically conductive layer of the first surface and an electrically conductive layer of the second surface through the core vias, wherein the upper layer is disposed on the first surface and comprises an electrically conductive layer connecting the core distribution layer and an external semiconductor element unit, and wherein a thickness of a thinnest layer among electrically conductive layers of the core distribution layer is the same as or greater than a thickness of a thinnest layer among the electrically conductive layers of the upper layer.

7. The semiconductor apparatus of claim 6,
wherein the thickness of the thinnest layer among the electrically conductive layers of the core distribution layer is greater than the thickness of the thinnest layer among the electrically conductive layers of the upper layer by 0.7 to 12 times.

8. The semiconductor apparatus of claim 6, further comprising:
an upper insulating layer and an upper distribution pattern,
wherein the upper insulating layer is disposed on the first surface,
the upper distribution pattern at least partially comprising a fine pattern is at least partially connected to the core distribution layer,
the upper distribution pattern is an electrically conductive layer embedded in the upper insulating layer, and
the fine pattern has a width of less than 4 μm with an interval of less than 4 μm.

9. The semiconductor apparatus of claim 6,
wherein the core distribution layer comprises a core distribution pattern comprising a second surface distribution pattern,
wherein the second surface distribution layer is an electrically conductive layer disposed on the second surface, and
wherein a thickness of an electrically conductive layer having a greatest thickness among the second surface distribution pattern is 0.7 to 20 times of the thickness of a thinnest layer among the electrically conductive layers of the upper layer.

10. A packaging substrate comprising:
a core layer and an upper layer disposed on the core layer,
the core layer comprising a glass substrate, a core via, and a core distribution layer disposed on a surface of the glass substrate or a surface of the core via, the glass substrate having a first surface and a second surface facing each other,
wherein the core via penetrates through the glass substrate in a thickness direction in a plural number,
wherein at least a part of the core distribution layer connects an electrically conductive layer of the first surface and an electrically conductive layer of the second surface through the core via penetrating through the glass substrate,
wherein the upper layer is disposed on the first surface and comprises an electrically conductive layer connecting the core distribution layer and an external semiconductor element unit, and
wherein a thickness of a thinnest layer among electrically conductive layers of the core distribution layer is the same as or greater than a thickness of a thinnest layer among the electrically conductive layers of the upper layer.

\* \* \* \* \*